(12) United States Patent
Oglesbee et al.

(10) Patent No.: US 6,331,764 B1
(45) Date of Patent: Dec. 18, 2001

(54) SUPPLEMENTAL BATTERY OVERCHARGE PROTECTION DEVICE

(75) Inventors: John Wendell Oglesbee, Watkinsville, GA (US); Arthur G. Burns, Plantation; Georgina More, Lakeland, both of FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/579,290

(22) Filed: May 25, 2000

Related U.S. Application Data

(63) Continuation of application No. PCT/US99/01911, filed on Jan. 29, 1999
(60) Provisional application No. 60/073,287, filed on Jan. 31, 1998, and provisional application No. 60/073,279, filed on Jan. 31, 1998.

(51) Int. Cl.[7] ....................................................... H02J 7/00
(52) U.S. Cl. ........................................... 320/136; 320/135
(58) Field of Search .................................... 320/136, 135, 320/153, 154, 150, 166; 324/426

(56) References Cited

U.S. PATENT DOCUMENTS

| | | | |
|---|---|---|---|
| 4,649,333 | * | 3/1987 | Moore .................................. 320/152 |
| 6,002,239 | * | 12/1999 | Maloizel .............................. 320/136 |

* cited by examiner

*Primary Examiner*—Peter S. Wong
*Assistant Examiner*—Lawrence Luk
(74) *Attorney, Agent, or Firm*—Philip H. Burrus, IV

(57) ABSTRACT

This invention includes a battery overprotection device comprising a thermal resistor, a zener diode, a pass element and a control circuit. The thermal resistor is used as an over-temperature limiting device, rather than an overcurrent device. By thermally coupling the thermal resistor to the zener diode, the thermal resistor protects the zener diode from "burning up" as a result of continuous power dissipation. When the zener is subjected to continuous power dissipation, its temperature rises. As the temperature rises, the thermal resistor's impedance increases, thereby reducing the power dissipation in the zener. The zener/thermal resistor combination serves as an auxiliary safety circuit for the transistor and control circuit.

19 Claims, 4 Drawing Sheets

SUPPLEMENTAL BATTERY OVERCHARGE PROTECTION DEVICE

RELATED APPLICATIONS

This application is a continuation from PCT Application No. PCT/US/99/01911, filed on Jan. 29, 1999. This application claims priority to U.S. Provisional Application No. 60/073,287 filed Jan. 31, 1998, entitled "Battery Highh Voltage Charge Protection" and U.S. Provisional Application No. 60/073,279 filed Jan. 31, 1998, entitled "Overcharge Protection Device for Li-Ion or Li-Polymer Rechargeable Battery Cells." The entirety of each of these provisional applications is incorporated herein by reference. This application is also related to co-pending and commonly assigned PCT Application No. PCT/US/99/01910, filed on even date, entitled "Overcharge Protection Device And Methods For Lithium Based Rechargeable Batteries", the entirety of which is incorporated herein by reference.

FIELD OF THE INVENTION

The present invention is directed to rechargeable batteries, such as lithium-ion or lithium-polymer rechargeable battery cells and other rechargeable battery chemistries, and more particularly to supplemental protection devices for overcharge protection circuits.

BACKGROUND OF THE INVENTION

Lithium-ion and lithium-polymer battery packs are used as a rechargeable energy source for many electronics applications, particularly consumer electronic device such as cellular mobile telephones. Lithium-based battery packs often require a switch device to protect the lithium cell or cells from overcharge. Current switch devices have limited capability for reliability under severe fault conditions that might occur as a result of a failed battery charger. If not mitigated, catastrophic failure of the lithium cells is possible.

What is needed is a circuit arrangement that provides supplemental protection for a switch device in an overcharge protection device, such as those used in rechargeable battery packs.

DETAILED DESCRIPTION OF A PREFERRED EMBODIMENT

Figure 1:
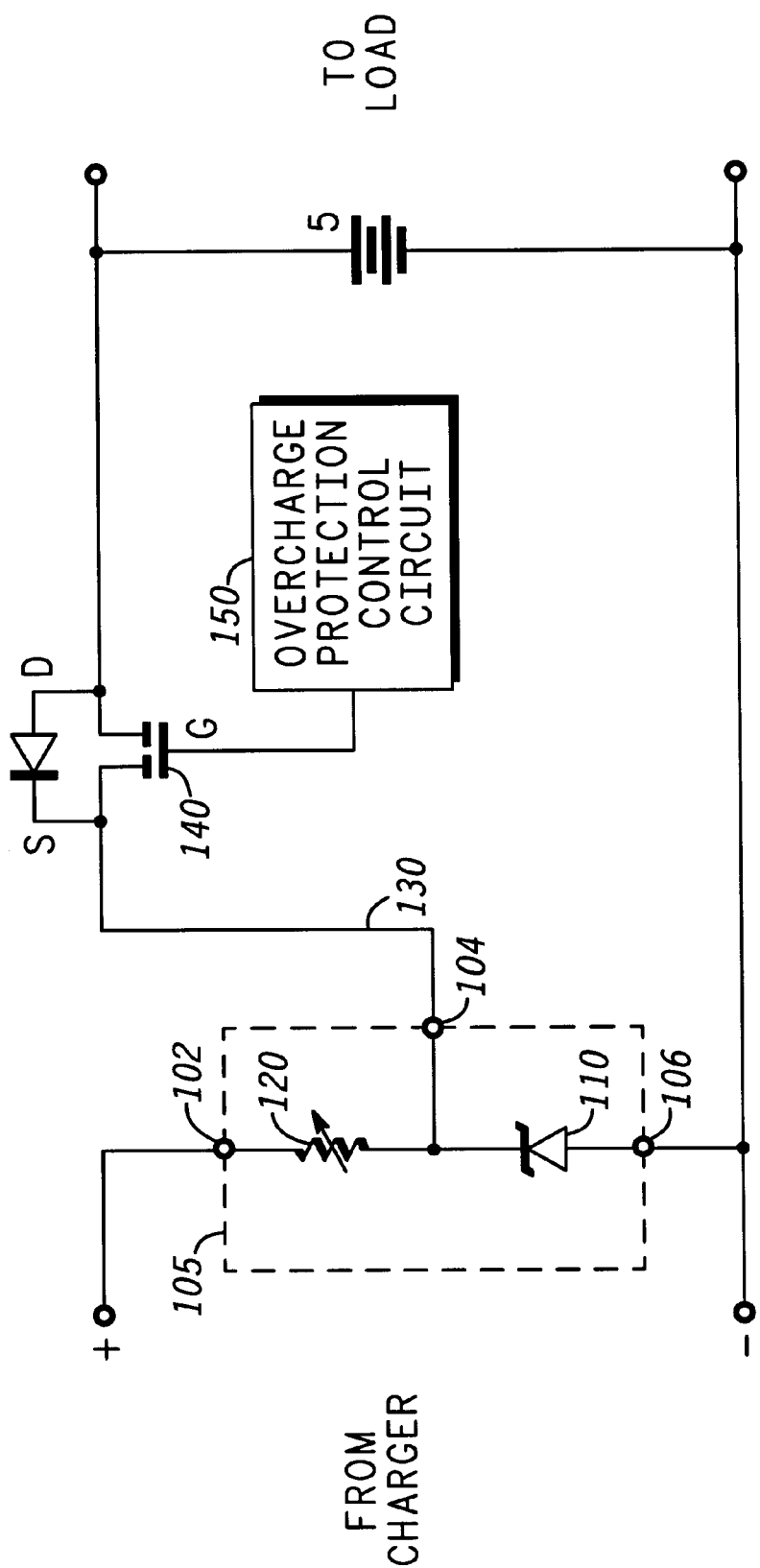
FIG. 1 is a schematic diagram showing the protection device according to the present invention.

Referring first to FIG. 1, the protection device according to the present invention is shown at reference numeral 100. The protection device 100 comprises a switch protection circuit 105 and a switch 140. The switch 140 is, for example, a P-channel field effect transistor (FET) switch. The switch 140 may be any suitable switch capable of opening or closing in response to a control signal. Another example of a suitable switch is a bipolar transistor switch. The switch 140 protects a rechargeable battery 5. The rechargeable battery 5 is, for example, a lithium-ion or lithium-polymer rechargeable battery. However, as will be explained hereinafter, the protection device 100 is useful to protect any type of a device from over-power conditions.

The switch protection circuit 105 comprises a zener diode 110 connected in series with a thermal resistor 120. The switch protection circuit 105 is connected across the output terminals of a battery charger (not shown). The FET switch 140 is controlled by an overcharge protection control circuit 150, as is well known in the art. The overcharge protection control circuit 150 turns the FET switch 140 off when it detects an overvoltage condition on the battery. The overcharge protection control circuit 150 typically comprises a comparator and a voltage reference. The voltage reference sets the overcharge conditions, and as an example, is 4.3 V.

Node 102 is an input to the switch protection circuit 105. Node 104 is the cathode of the zener diode 110 and node 106 is the anode of the zener diode 110. The FET switch 140 has source, drain and gate terminals. The source terminal corresponds to an input terminal of the FET switch 140 and the drain terminal corresponds to an output terminal of the FET switch 140. A connection 130 is made from the cathode 104 of the zener diode 110 to the source terminal of the FET switch 140. The gate of the FET switch 140 is connected to the overcharge protection control circuit 150. The drain terminal of the FET switch 140 is connected to one terminal of the rechargeable battery cell or cells 5 to be protected. When the FET switch 140 is open, current can flow from the cathode 104 of the zener diode 110 through the source terminal to the drain terminal and into the rechargeable battery 5. When the FET switch 140 is closed, current cannot flow from the source terminal to the drain terminal.

The zener diode 110 is, for example, a high current transient suppression zener diode implemented in a semiconductor die combined with a non linear positive temperature coefficient resistor as the thermal resistor 120, in an integrated isothermal type package.

Zener diodes have long been favored as voltage clamping devices for overvoltage clamping applications at low voltages because of their superior clamping factor characteristics. As is known in the art, the clamping factor is the ratio of maximum clamp voltage to operating voltage. The zener diode 110 is optimized to effectively clamp high peak currents in the reverse avalanche region. An example of a suitable zener diode 110 is the Motorola 1.5KE10 (IN6271A), which is a 10 volt device. This device will clamp reverse peak currents of 103 amps, at a clamp voltage of 14.5 volts. A device of this type would allow an FET rated at 20 volts to be used as a protection switch device, with a voltage design margin of 25%. A battery charger would have to put out a peak transient current in excess of 100 amperes at a voltage of 14 volts in order to damage either the zener diode or the FET from transient energy effects. This is a factor of approximately one hundred times the normal charger output power rating and is a safe margin for charger failure conditions for most types of chargers presently on the market.

The zener diode 110 can clamp high transient energy levels (the aforementioned device is rated for 1500 watts of transient power). However, it has only a very limited continuous power capability. This represents a significant disadvantage of these types of devices. The zener diode 110 on a continuous basis, with the usual derating factors for package mounting and temperature rise, will typically be able to dissipate less than one watt of continuous power. Most chargers, under certain conditions of failure, can easily exceed both the operating voltage rating and continuous power rating of the transient protection zener. The transient protection zener diode, to be used reliably in this application, must itself be protected from effects of continuous power dissipation caused by a failed charger system.

If the continuous power is not limited, the zener diode 110 will always fail shorted, which is fail safe. However, a common failure that occurs is melting of the lead mounting solder, which may open the circuit to the device. This is not failsafe. The zener itself does not fail, but the solder connection does.

The thermal resistor 120 is an overcurrent and overtemperature sensitive device which depends on a rapid non-linear increase in self resistance as the temperature of the device increases. Examples of suitable thermal resistors are the PTC device manufactured by Bourns Corp., a resettable fuse device manufactured by Panasonic Corp., and the PolySwitch™ thermal resistor manufactured by Raychem Corp. For example, the RXE110 PolySwitch™ device is a 1.1 amp 60 volt thermal resistor that is suitable for use in the protection device 100. The RXE110 device has a resistance of 0.250 ohms at room temperature, and enters a high impedance state capable of interrupting 40 amperes at 60 volts rms at higher temperatures. 60 volts rms would be a peak voltage of 85 volts. The exact interrupt rating would also be influenced by other circuit parameters. The power loss in this device at a typical charging current of 1 ampere is only 250 milliwatts, which would not require heatsinking or contribute significantly to battery heating.

Thermal resistor devices have been optimized as overcurrent protective devices. In this mode of operation, excessive current in the device causes self heating of the device. When a critical temperature is reached, the device resistance increases rapidly by several decades, thus reducing current in the circuit in which the device is used as protection.

In the protection device of the invention, the thermal resistor 120 is used as an overtemperature limiting device, rather than an overcurrent device. By thermally coupling the thermal resistor 120 to the transient zener diode die, the thermal resistor 120 characteristics operate to protect the zener diode 110 from overtemperature due to continuous power dissipation. If the zener diode 10 is subjected to continuous dissipation in excess of its ability to dissipate heat, its temperature will rise. If the zener diode 110 is thermally coupled to a thermal resistor 120, the temperature of the thermal resistor 120 will closely track the zener diode die temperature. As the temperature of the two elements continues to rise, the thermal resistor 120 will dramatically increase in resistance. This occurs in the range of 90 to 120 degrees C., which is well below the operating junction temperature limits of the zener, approximately 230 degrees C. The dramatic increase in the resistance of the thermal resistor 120 reduces the current from the battery charger, and therefore the clamping current and power dissipation of the zener diode 110. The integral zener diode-thermal resistor package, if subjected to excessive voltage from a failed charger, will operate to limit both the current and power in the zener. A steady state condition will occur at the temperature point where the resistance change of the thermal resistor is balanced against reduced zener dissipation resulting from the change in resistance. At this point, heat flow from the zener diode will be balanced with the micro-environment of the zener diode thereby terminating any further increase in temperature. During this sequence the zener continues to clamp the voltage to the FET switch 140 at a safe level of less than 15 volts.

When the zener diode 110 and thermal resistor 120 are coupled thermally in a single integrated device, the characteristics of the resultant device become ideal for supplementary protection of the FET switch 140 used in battery safety switch applications.

Figure 2:
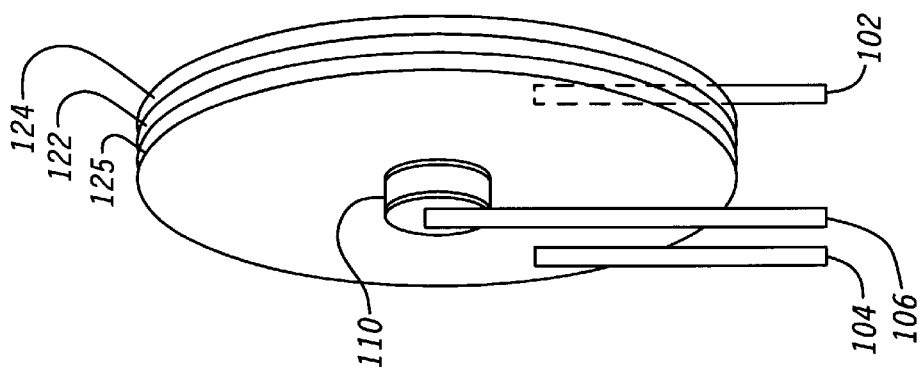
FIG. 2 is a perspective view of a physical configuration of the protection device.
Figure 3:
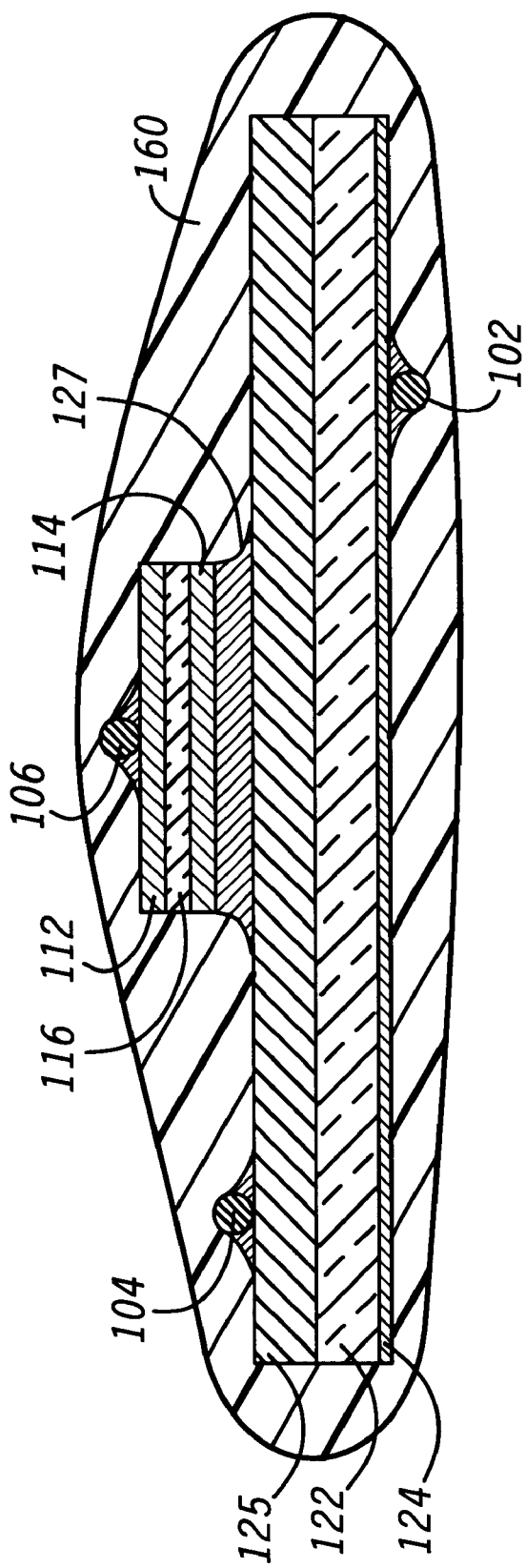
FIG. 3 is a cross-sectional view of the physical configuration of FIG. 2.

FIGS. 2 and 3 illustrate a possible construction of the switch protection circuit 105 of the protection device 110. The input node or wire 102, zener cathode 104 and anode 106 correspond to the nodes shown in FIG. 1. The zener diode 110 comprises two metalization layers 112 and 114 that sandwich a zener die layer 116. The thermal resistor 120 consists of a resistor element layer 122 and a metalization or conductive layer 124.

A heat spreader layer 125 is used to spread the heat of the zener die uniformly over the larger surface of the resistor element of the thermal resistor 120. The heat spreader layer 125 is, for example, made of copper or similar material suitable for soldering other components to it. The copper may be plated with tin or nickel. The zener diode 110 is lead solder-bonded 127 to the heat spreader layer 125. The thermal resistor 120 is affixed to the other side of the heat spreader layer 125 with the resistor element layer in contact with the heat spreader layer 125. The switch protection circuit 105 is then dipped in a protective coating 160, although other packaging options are possible.

Figure 4:
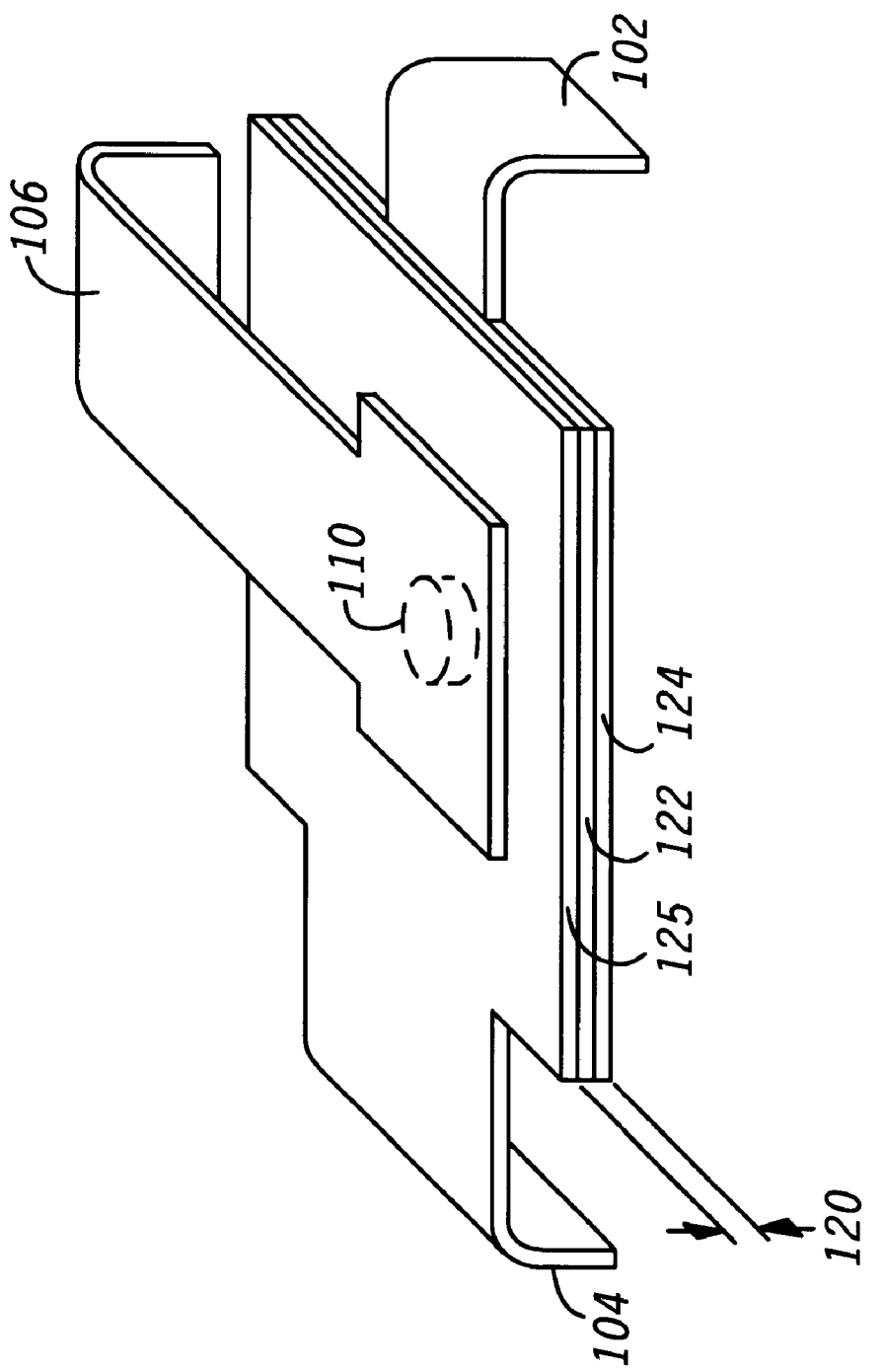
FIG. 4 is perspective view showing another possible physical configuration of the protection device shown in FIG. 1.

FIG. 4 illustrates another possible physical configuration of the protection device 100 in which the switch protection circuit 105 has a rectangular configuration, but is otherwise similar to the configuration shown in FIGS. 2 and 3.

With reference to FIG. 1, the operation of the protection device 100 of the present invention is as follows. In a battery pack, the FET switch 140 protects the lithium battery cells 5 from overcharge by opening in response to a control signal applied to its gate terminal from the overcharge protection control circuit 150. The zener diode 110 clamp protects the FET switch 140 from overvoltage conditions that may result from a failed charger (run-away charger that continues to charge after the battery is fully charged). The thermal resistor 120 protects the zener diode 110 from excessive temperature rise due to continuous power dissipation, by effectively disconnecting current from the battery charger as the temperature of the zener rises above a predetermined threshold. The thermal resistor 110 protects the zener diode 110, the FET switch 140, and consequently the battery 5, from the effects of a failed charger. The advantage of the protection device of the present invention is that the thermal resistor has much higher interrupt ratings for voltage and current than a FET by itself can provide at a reasonable cost. The overall safety margin of the battery pack is raised significantly from that without such protection. When the overcharge condition terminates, the zener diode will eventually stop shunting current and consequently will cool down. In response, the impedance of the thermal resistor will decrease to a level to permit current from the battery charger to conduct through the FET switch 140 and into the battery 5.

The predicted operating characteristics of this invention are summarized as follows.

The FET switch 140 is protected from overvoltage by the clamping action of the zener diode 110. The zener diode 110 and the FET switch 140 are both protected from high values of overvoltage, overcurrent, and power, by the thermal limiting disconnect feature of the thermal resistor 120.

In normal operation, the protection device 100 according to the present invention would dissipate less than a few tenths of a watt of stray power. Therefore, no heatsinking of the device would be required to handle normal charging current.

Under fault conditions, the maximum temperature rise of the device would be self limited by the thermal resistor to about 120 degrees C. Because the device is thermally self-limited, overheating damage to other components and/or circuit card substrates is not likely to occur.

The protection device 100 according to the present invention is expected to operate over an exceedingly wide range of charger fault stress conditions relating to overvoltage, overcurrent, or excessive power. The peak power required to damage the device would have to be so intense as to establish a thermal gradient across the device due to transient heating of the zener diode die in excess of 100 degrees C. With proper coordination of heat spreader thermal mass, thermal resistance, thermal resistor electrical resistance, and zener characteristics, this type of thermal gradient phenomena can be excluded by the design of the device, except at extremely high fault power transients. In other words, the device can be designed such that destructive thermal transient gradients only occur at extremely high peak power levels. Such input peak power levels are unlikely, even in the case of a severely failed and mis-matched charger. In addition, the protection device resets itself without damage when the fault conditions are removed. The protection device could be mass-produced at reasonable cost using existing manufacturing technologies, and can be integrated within a rechargeable battery pack.

It is expected that additional improvements in the design of this invention will allow it to be used over an even wider range of potential charger fault stress levels. For example, since the thermal resistor device is used only as an over-temperature device, changes or advances in the composition of the thermal resistor materials may allow higher interrupt ratings, while at the same time reducing the power losses of the device under normal charging currents. Also, it is expected that the transient clamping range of the invention can be further improved by using either a larger size zener die, or multiple smaller zener die in parallel, distributed over the heat spreader surface.

The protection device according to the present invention has widespread applications as a general purpose low voltage transient protective device. Metal oxide varistors (MOVs) and zener transient voltage suppressers (TVSs) have always been subject to failure and destruction from continuous power abuse when used in transient power applications. The protection device according to the present invention addresses this problem by making the transient protection device self protected from the effects of excessive internal power dissipation. This novel approach results in a self protected transient power clamping device and is a significant step forward in transient protection device strategy.

To summarize, the present invention is directed to a protection device comprising: a switch having an input terminal and an output terminal, the output terminal for connection to a terminal of a device which is to be protected, the switch preventing current to flow from its input terminal to the output terminal and into the device when it is opened; and a switch protection circuit comprising a zener diode and a thermal resistor connected in series, the switch protection circuit for connection in parallel with terminals of a power supply, the zener diode being thermally coupled to the thermal resistor and a cathode of the zener diode being connected to the input terminal of the switch; wherein the zener diode protects the switch from overvoltage conditions by shunting current away from the switch, and the thermal resistor protects the zener diode from overtemperature conditions by entering a high impedance state to effectively disconnect current from the power source when the temperature of the zener diode exceeds a predetermined threshold.

In particular, the present invention is applicable to providing supplemental protection to a protective switch in a rechargeable battery application, wherein the protection device comprises: a switch having an input terminal and an output terminal, the output terminal for connection to a terminal of a rechargeable battery to be charged, the switch preventing current to flow from its input terminal to the output terminal and into the rechargeable battery when it is opened; and a switch protection circuit comprising a zener diode and a thermal resistor connected in series, the switch protection circuit for connection in parallel with output terminals of a battery charger, the zener diode being thermally coupled to the thermal resistor and a cathode of the zener diode being connected to the input terminal of the switch; wherein the zener diode protects the switch from overvoltage conditions by shunting current away from the switch, and the thermal resistor protects the zener diode from overtemperature conditions by entering a high impedance state to effectively disconnect current from the battery charger when the temperature of the zener diode exceeds a predetermined threshold.

Moreover, the present invention is directed to a switch protection circuit for protecting a switch having an input terminal and an output terminal, the output terminal of the switch being coupled to a rechargeable battery that is to be protected, the switch protection circuit for connection across output terminals of a battery charger, the switch protection circuit comprising: a zener diode and a thermal resistor connected in series, the zener diode being thermally coupled to the thermal resistor, the cathode of the zener diode being connected to an input terminal of the switch; wherein the zener diode protects the switch from overvoltage conditions by shunting current away from the switch, and the thermal resistor protects the zener diode from overtemperature conditions by entering a high impedance state to effectively disconnect current from a battery charger when the temperature of the zener diode exceeds a predetermined threshold.

The foregoing description is intended by way of example only and is not intended to limit the present invention in any way except as set forth in the following claims.

What is claimed is:

1. A protection device comprising:
   a switch having an input terminal and an output terminal, the output terminal for connection to a terminal of a rechargeable battery to be charged, the switch preventing current to flow from its input terminal to the output terminal and into the rechargeable battery when it is opened; and
   a switch protection circuit comprising a zener diode and a thermal resistor connected in series, the switch protection circuit for connection in parallel with output terminals of a battery charger, the zener diode being thermally coupled to the thermal resistor and a cathode of the zener diode being connected to the input terminal of the switch;
   wherein the zener diode protects the switch from overvoltage conditions by shunting current away from the switch, and the thermal resistor protects the zener diode from overtemperature conditions by entering a high impedance state to effectively disconnect current from the battery charger when the temperature of the zener diode exceeds a predetermined threshold.

2. The protection device of claim 1, wherein the thermal resistor is a non-linear positive coefficient temperature sensitive resistor having a low resistance at normal temperatures and having a high resistance at higher temperatures to effectively open circuit current flow therethrough.

3. The protection device of claim 1, wherein the zener diode and the thermal resistor are combined in a single integrated circuit package.

4. A rechargeable battery comprising the protection device of claim 1 integrated therewith.

5. The protection device of claim 1, and further comprising a heat spreader for thermally coupling the thermal resistor to the zener diode.

6. The protection device of claim 5, wherein the zener diode comprises a semiconductor die layer and first and second metalization layers disposed around the semiconductor die layer, the thermal resistor comprises a resistor element layer and a conductive layer, wherein the zener diode and the thermal resistor are attached to the heat spreader so that the resistor element layer of the thermal resistor is in contact with the heat spreader.

7. The protection device of claim 1, wherein the switch is a field effect transistor (FET) switch comprising a source terminal, drain terminal and gate terminal, the source terminal corresponding to the input terminal of the switch and the drain terminal corresponding to the output terminal of the switch.

8. The protection device of claim 7, and further comprising an overcharge protection control circuit coupled to the gate terminal of the FET switch to control whether the FET switch is open or closed in response to charging conditions of the rechargeable battery.

9. A switch protection circuit for protecting a switch having an input terminal and an output terminal, the output terminal of the switch being coupled to a rechargeable battery that is to be protected, the switch protection circuit for connection across output terminals of a battery charger, the switch protection circuit comprising:
   a zener diode and a thermal resistor connected in series, the zener diode being thermally coupled to the thermal resistor, the cathode of the zener diode being connected to an input terminal of the switch;
   wherein the zener diode protects the switch from overvoltage conditions by shunting current away from the switch, and the thermal resistor protects the zener diode from overtemperature conditions by entering a high impedance state to effectively disconnect current from a battery charger when the temperature of the zener diode exceeds a predetermined threshold.

10. The switch protection circuit of claim 9, wherein the thermal resistor is a non-linear positive coefficient temperature sensitive resistor halving a low resistance at normal temperatures and having a high resistance at higher temperatures to effectively open circuit current flow therethrough.

11. The switch protection circuit of claim 9, wherein the zener diode and the thermal resistor are combined in a single integrated circuit package.

12. The switch protection circuit of claim 9, and further comprising a heat spreader for thermally coupling the thermal resistor to the zener diode.

13. The switch protection device of claim 12, wherein the zener diode comprises a semiconductor die layer and first and second metalization layers disposed around the semiconductor die layer, the thermal resistor comprises a resistor element layer and a conductive layer, wherein the zener diode and the thermal resistor are attached to the heat spreader so that the resistor element layer of the thermal resistor is in contact with the heat spreader.

14. A protection device comprising:
   a switch having an input terminal and an output terminal, the output terminal for connection to a terminal of a device which is to he protected, the switch preventing current to flow from its input terminal to the output terminal and into the device when it is opened; and
   a switch protection circuit comprising a zener diode and a thermal resistor connected in series, the switch protection circuit for connection in parallel with terminals of a power supply, the zener diode being thermally coupled to the thermal resistor and a cathode of the zener diode being connected to the input terminal of the switch;
   wherein the zener diode protects the switch from overvoltage conditions by shunting current away from the switch, and the thermal resistor protects the zener diode from overtemperature conditions by entering a high impedance state to effectively disconnect current from the power source when the temperature of the zener diode exceeds a predetermined threshold.

15. The protection device of claim 14, wherein the thermal resistor is a non-linear positive coefficient temperature sensitive resistor having a low resistance at normal temperatures and having a high resistance at higher temperatures to effectively open circuit current flow therethrough.

16. The protection device of claim 14, wherein the zener diode and the thermal resistor are combined in a single integrated circuit package.

17. The protection device of claim 14, and further comprising a heat spreader for thermally coupling the thermal resistor to the zener diode.

18. The protection device of claim 17, wherein the zener diode comprises a semiconductor die layer and first and second metalization layers disposed around the semiconductor die layer, the thermal resistor comprises a resistor element layer and a conductive layer, wherein the zener diode and the thermal resistor are attached to the heat spreader so that the resistor element layer of the thermal resistor is in contact with the heat spreader.

19. The protection device of claim 14, wherein the switch is a field effect transistor (FET) switch comprising a source terminal, drain terminal and gate terminal, the source terminal corresponding to the input terminal of the switch and the drain terminal corresponding to the output terminal of the switch.

* * * * *